(12) United States Patent
Jeon et al.

(10) Patent No.: US 11,634,030 B2
(45) Date of Patent: Apr. 25, 2023

(54) VEHICLE SMART GARNISH

(71) Applicants: SEOYON E-HWA CO., LTD., Anyang (KR); SEOYON AMERICA CORPORATION, Auburn Hills, MI (US)

(72) Inventors: Jong Hwan Jeon, Anyang (KR); Sung Won Lee, Asan (KR)

(*) Notice: Subject to any disclaimer, the term of this patent is extended or adjusted under 35 U.S.C. 154(b) by 0 days.

(21) Appl. No.: 17/412,462

(22) Filed: Aug. 26, 2021

(65) Prior Publication Data

US 2022/0126689 A1 Apr. 28, 2022

(30) Foreign Application Priority Data

Oct. 27, 2020 (KR) .................. 10-2020-0140336

(51) Int. Cl.
*B60K 35/00* (2006.01)
*G06F 3/041* (2006.01)
*G06F 3/044* (2006.01)

(52) U.S. Cl.
CPC .............. *B60K 35/00* (2013.01); *G06F 3/044* (2013.01); *G06F 3/0414* (2013.01); *B60K 2370/143* (2019.05); *B60K 2370/158* (2019.05); *B60K 2370/34* (2019.05); *B60K 2370/688* (2019.05); *B60K 2370/691* (2019.05); *G06F 2203/04105* (2013.01)

(58) Field of Classification Search
None
See application file for complete search history.

(56) References Cited

U.S. PATENT DOCUMENTS

| 2004/0213008 A1* | 10/2004 | Bayersdorfer | B60K 35/00 362/545 |
| 2006/0147676 A1* | 7/2006 | Yoshida | G02B 5/0278 428/143 |
| 2006/0255683 A1* | 11/2006 | Suzuki | G06F 3/0362 310/317 |
| 2011/0143132 A1* | 6/2011 | Jung | G02F 1/13439 428/458 |
| 2012/0217147 A1* | 8/2012 | Porter | G06F 3/0443 200/600 |

(Continued)

FOREIGN PATENT DOCUMENTS

| JP | 2014043210 A | 3/2014 |
| KR | 10-1985374 B1 | 5/2019 |
| KR | 102038020 B1 | 10/2019 |

*Primary Examiner* — Christopher R Lamb
(74) *Attorney, Agent, or Firm* — Harvest IP Law LLP

(57) ABSTRACT

A vehicle smart garnish is provided. The vehicle smart garnish includes an upper casing formed with a plurality of symbols to which light is emitted, a capacitive touch sensor pad corresponding to at least one of the plurality of symbols and recognizing a touch, a holder casing in which the capacitive touch sensor pad is mounted and coupled from a rear of the upper casing, and a circuit board positioned behind the holder casing and on which a light emitting element emitting light is mounted and configured to detect a touch signal of the capacitive touch sensor pad, wherein the holder casing includes a light guide path for guiding the light emitted from the light emitting element to the plurality of symbols, and a light reflection layer is formed on a partition of the light guide path.

18 Claims, 12 Drawing Sheets

(56) References Cited

U.S. PATENT DOCUMENTS

| | | | |
|---|---|---|---|
| 2016/0132113 A1* | 5/2016 | Hotchkiss | B60K 35/00 |
| | | | 345/173 |
| 2017/0235414 A1* | 8/2017 | Ding | G02F 1/136286 |
| | | | 345/174 |
| 2019/0278473 A1* | 9/2019 | Fornasier | G06F 3/04817 |
| 2020/0139816 A1* | 5/2020 | Carvalho | B60K 37/06 |
| 2021/0086617 A1 | 3/2021 | Jeon | |

* cited by examiner

VEHICLE SMART GARNISH

CROSS REFERENCE TO RELATED APPLICATION

This application is based on and claims priority to Korean Patent Application No. 10-2020-0140336, filed on Oct. 27, 2020 in the Korean Intellectual Property Office, the disclosure of which is incorporated herein by reference in its entirety.

BACKGROUND

1. Field

Apparatuses and methods consistent with exemplary embodiments relate to a vehicle smart garnish and, more particularly, to a vehicle smart garnish capable of improving a light emission characteristic to visually stand out a switch, a symbol mark, or the like, which is positioned in a garnish. The vehicle smart garnish can further improve aesthetics of an interior of the vehicle and increase the efficiency of a light emitting element.

2. Description of the Related Art

With the development of vehicle technology, various functions for providing convenience to a driver or a passenger are mounted on a vehicle. Various vehicle switching technologies for selectively performing these various functions have also been proposed.

Particularly, vehicle switches have various structures, materials, and shapes so that they can be applied to various components such as a vehicle garnish, a dashboard, and an armrest to satisfy consumers' desire for convenience and aesthetic features of vehicle interior materials, and also provide a simple function of turning on/off operation.

For example, as a related art smart garnish for vehicles, a switching function is built-in in a garnish that is mounted on a vehicle interior material. Here, light is emitted to a symbol corresponding to a switch on an external surface of the garnish to make the symbol stand out visually.

In the related art, due to a structure detected by a touch sensor, light is necessarily emitted from behind a casing in which a transparent touch sensor pad is stably mounted, thereby causing a symbol to appear visually conspicuous. For this reason, a light guide path for guiding light is formed in the casing in which the transparent touch sensor pad is stably mounted. However, because this casing is formed by plastic injection molding, a portion of light is absorbed into a wall surface of the casing while the light propagates along the light guide path, resulting in loss of light. As a result, there occurs a problem in that the intensity of the emitted light to make the symbol appear visually conspicuous is decreased. In order to compensate for the decrease in light intensity, there is a need to mount more light emitting elements.

When the light emitted from the light emitting element passes through the symbol, a center portion of the light emitting element appears visually conspicuous as a spot. Further, as a portion of the symbol moves away from the center portion of the light emitting element, the intensity of light in the portion of the symbol decreases. Therefore, there is a problem that a shape of the symbol is not uniformly visually conspicuous.

SUMMARY

Aspects of one or more exemplary embodiments provide a method for improving a light emission characteristic to visually stand out a switch, a symbol mark, or the like, which is positioned in a garnish, thereby improving aesthetic features of an interior of a vehicle and increasing the efficiency of a light emitting element.

Additional aspects will be set forth in part in the description which follows and, in part, will become apparent from the description, or may be learned by practice of the exemplary embodiments.

According to an aspect of an exemplary embodiment, there is provided a vehicle smart garnish including: an upper casing formed with a plurality of symbols to which light is emitted; a capacitive touch sensor pad corresponding to at least one of the plurality of symbols and recognizing a touch; a holder casing in which the capacitive touch sensor pad is mounted and coupled from a rear of the upper casing; and a circuit board positioned behind the holder casing and on which a light emitting element emitting light is mounted and configured to detect a touch signal of the capacitive touch sensor pad, wherein the holder casing includes a light guide path for guiding the light emitted from the light emitting element to the plurality of symbols, and a light reflection layer is formed on a partition of the light guide path.

The light reflection layer may be made of a glossy material, may reflect the light entering from a first side of the light guide path, and emit the reflected light to a second side of the light guide path.

The light reflection layer may be formed of a material containing indium.

The light guide path may include: a light inlet formed on a first side of the light guide path through which the light enters; a light propagation path having the partition for guiding the light entering through the light inlet, the light reflection layer being formed on the partition; and a light outlet formed on a second side of the light guide path through which the light exits.

The light outlet may include a transparent optical window through which the light passes.

A surface roughness may be formed on at least one of front and rear surfaces of the transparent optical window.

A thickness of the transparent optical window may be 1.2 mm to 1.5 mm to minimize a loss of light passing through the transparent optical window.

The surface roughness may have a shape in which fine protrusions are regularly or irregularly distributed.

The vehicle smart garnish may further include a haptic actuator configured to vibrate the holder casing in a vertical direction.

The holder casing may include a support leg protruding downward from a rear surface thereof and on which the haptic actuator is mounted.

The vehicle smart garnish may further a body casing in which the circuit board is mounted.

A through-hole through which the support leg of the holder casing passes may be formed in the circuit board, and the haptic actuator may vibrate in the vertical direction in the through-hole.

The vehicle smart garnish may further include a buffer with a first side fastened to the holder casing and a second side fastened to the body casing to stably maintain the body casing against vertical vibration of the holder casing.

The buffer may be a plate spring capable of absorbing the vibration in the vertical direction.

An opening may be formed to open inwardly from an edge of the circuit board, a first buffer fastening part protruding through the opening in the circuit board and fastened to one end of the buffer may be formed in the holder casing, and a second buffer fastening part to which the other end of the buffer is fastened may be formed on the body casing.

The vehicle smart garnish may further include a lower casing coupled to the body casing from the rear and having an internal space in which the haptic actuator and the buffer are positioned.

The vehicle smart garnish may further include a capacitive force sensor pad configured to recognize that pressure is applied to at least one of the plurality of symbols, wherein the capacitive touch sensor pad and the capacitive force sensor pad may be sequentially mounted in the holder casing, and the circuit board may detect a pressure application signal of the capacitive force sensor pad.

A touch electrode pad may be formed on the capacitive touch sensor pad in a position corresponding to the plurality of symbols of the upper casing, an electrically insulated region spaced apart from the touch electrode pad by a predetermined distance may be formed as a ground electrode pad serving as a counter electrode of the touch electrode pad, and a connection member extending from the touch electrode pad and the ground electrode pad and connected to the circuit board may be formed in the capacitive touch sensor pad. A capacitive force electrode pad may be formed on the capacitive force sensor pad in a position corresponding to the plurality of symbols of the upper casing, and a connection member extending from the capacitive force electrode pad and connected to the circuit board may be formed in the capacitive force sensor pad.

According to an aspect of another exemplary embodiment, there is provided a vehicle smart garnish including: an upper casing formed with a plurality of symbols to which light is emitted; a capacitive touch sensor pad corresponding to at least one of the plurality of symbols and recognizing a touch; a capacitive force sensor pad configured to recognize that pressure is applied to at least one of the plurality of symbols; a holder casing in which the capacitive touch sensor pad and the capacitive force sensor pad are sequentially mounted and coupled from a rear of the upper casing; and a circuit board positioned behind the holder casing and on which a light emitting element emitting light is mounted and configured to detect a touch signal of the capacitive touch sensor pad and a pressure application signal of the capacitive force sensor pad, wherein the holder casing includes a light guide path for guiding the light emitted from the light emitting element to the plurality of symbols, and a light reflection layer is formed on a partition of the light guide path.

The capacitive touch sensor pad and the capacitive force sensor pad may be spaced apart from each other by a predetermined distance to form a space therebetween, or a dielectric layer may be interposed therebetween.

According to one or more exemplary embodiments, a light emission characteristic to visually stand out a switch, a symbol mark, or the like, which is positioned in a garnish can be improved. Thus, aesthetics of an interior of the vehicle can be enhanced, and the efficiency of the light emitting element can be increased.

According to one or more exemplary embodiments, the light reflection layer is formed on the light guide path in the holder casing. Thus, the light emitted from the light emitting element can be emitted to the symbol on the upper casing while loss of the light is maximally reduced.

In addition, according to one or more exemplary embodiments, the light outlet of the light guide path is formed as an optical window, and the surface roughness is produced on a surface of the optical window. Thus, the entire symbol on the upper casing can have the uniform light emission characteristic.

Moreover, according to one or more exemplary embodiments, the vibration in the upward and downward direction by the haptic actuator can make a user recognize whether switching is performed to stably maintain the circuit board against the vibration.

Furthermore, according to one or more exemplary embodiments, when the user simultaneously applies pressure and touch to the symbol, the user can recognize touch sensing and force sensing. Thus, a sensing error caused by an incorrect touch can be eliminated.

BRIEF DESCRIPTION OF THE DRAWINGS

The above and other aspects will be more clearly understood from the following description of the exemplary embodiments with reference to the accompanying drawings, in which.

DETAILED DESCRIPTION

Figure 1:
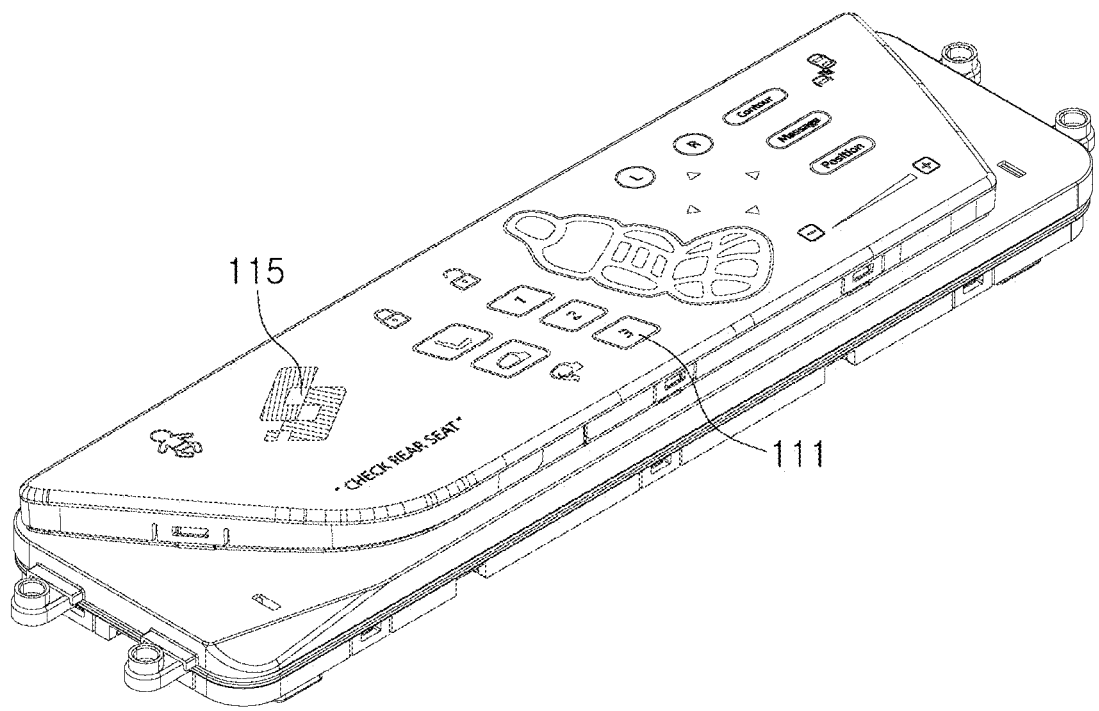
FIG. 1 is a perspective view illustrating a vehicle smart garnish according to a first exemplary embodiment.

Various modifications and various embodiments will be described with reference to the accompanying drawings. However, it should be noted that the various embodiments are not for limiting the scope of the disclosure to the specific embodiment, but they should be interpreted to include all modifications, equivalents, or substitutions of the embodiments included within the spirit and scope disclosed herein.

Terms used herein are used to merely describe specific embodiments and are not intended to limit the scope of the disclosure. As used herein, the singular forms "a", "an", and "the" are intended to include the plural forms as well, unless the context clearly indicates otherwise. In this specification, terms such as "comprise," "include," and/or "have/has" should be construed as designating that there are such features, regions, integers, steps, operations, elements, components, and/or a combination thereof in the specification, not to exclude the presence or possibility of adding of one or more of other features, regions, integers, steps, operations, elements, components, and/or combinations thereof.

Terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, the components associated with such an ordinal number should not be limited in the order of use, placement order, or the like. If necessary, each ordinal number may be used interchangeably.

Hereinafter, exemplary embodiments will be described in detail with reference to the accompanying drawings. However, the disclosure may be embodied in many different forms and is not limited to the embodiments described herein, and those skilled in the art may implement various modified forms of the contents described herein without departing from the scope of the disclosure. In order to clearly illustrate the disclosure in the drawings, some of the elements that are not essential to the complete understanding of the disclosure may be omitted, and like reference numerals refer to like elements throughout the specification.

FIG. 1 is a perspective view illustrating a vehicle smart garnish according to a first exemplary embodiment.

A smart garnish 100 according to the exemplary embodiment may have various shapes and designs so as to improve the aesthetic features of the interior of the vehicle and increase the emotional attachment of the occupant to the vehicle by being mounted on the vehicle interior material.

Referring to FIG. 1, the smart garnish 100 includes symbols 111 corresponding to switching functions for performing various vehicle functions and various mark symbols 115. Light emission causes these symbols 111 and 115 to appear visually conspicuous, and thus the aesthetic feature is enhanced.

Figure 2:
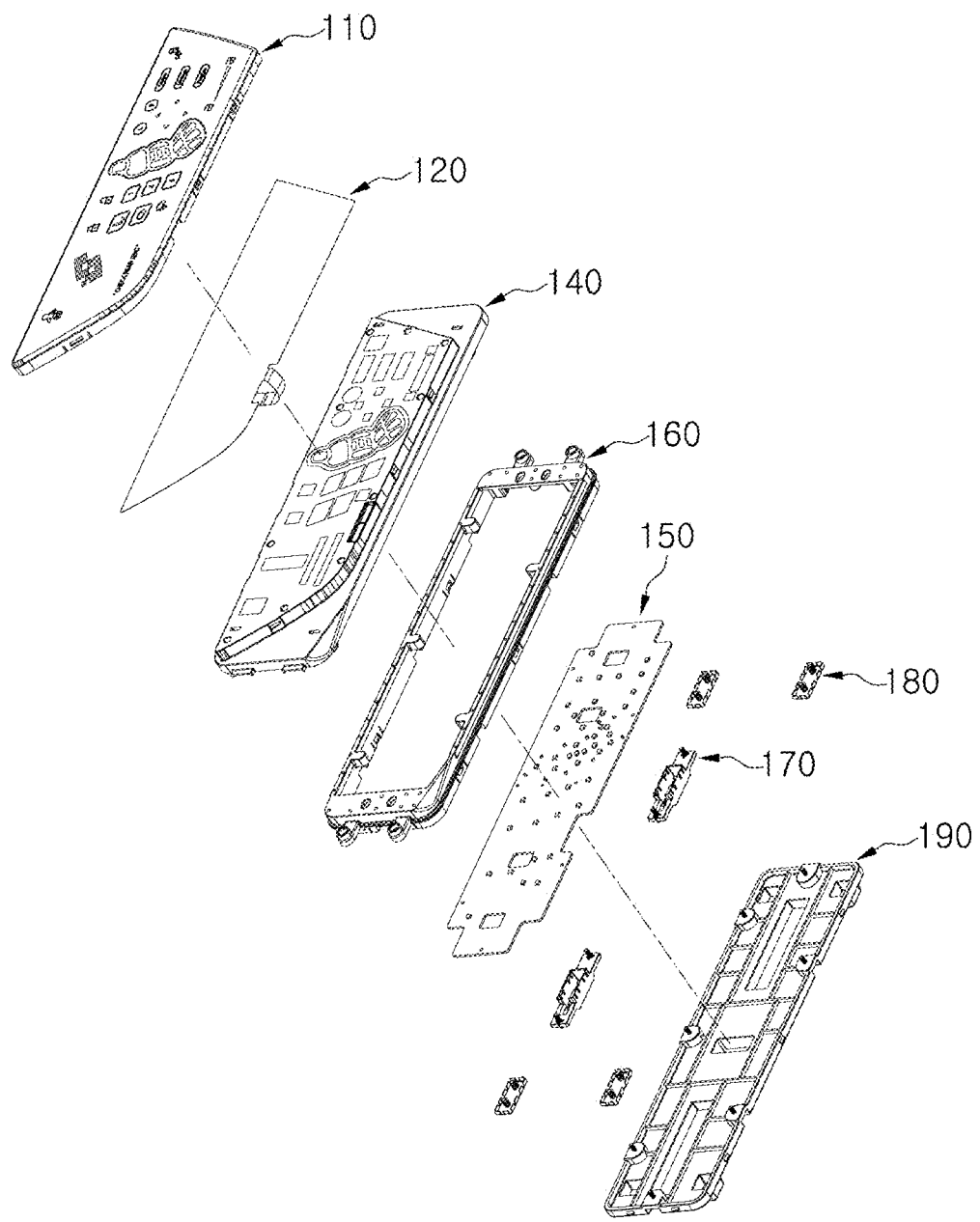
FIG. 2 is an exploded perspective view illustrating each component of the vehicle smart garnish of FIG. 1 viewed from a front.
Figure 3:
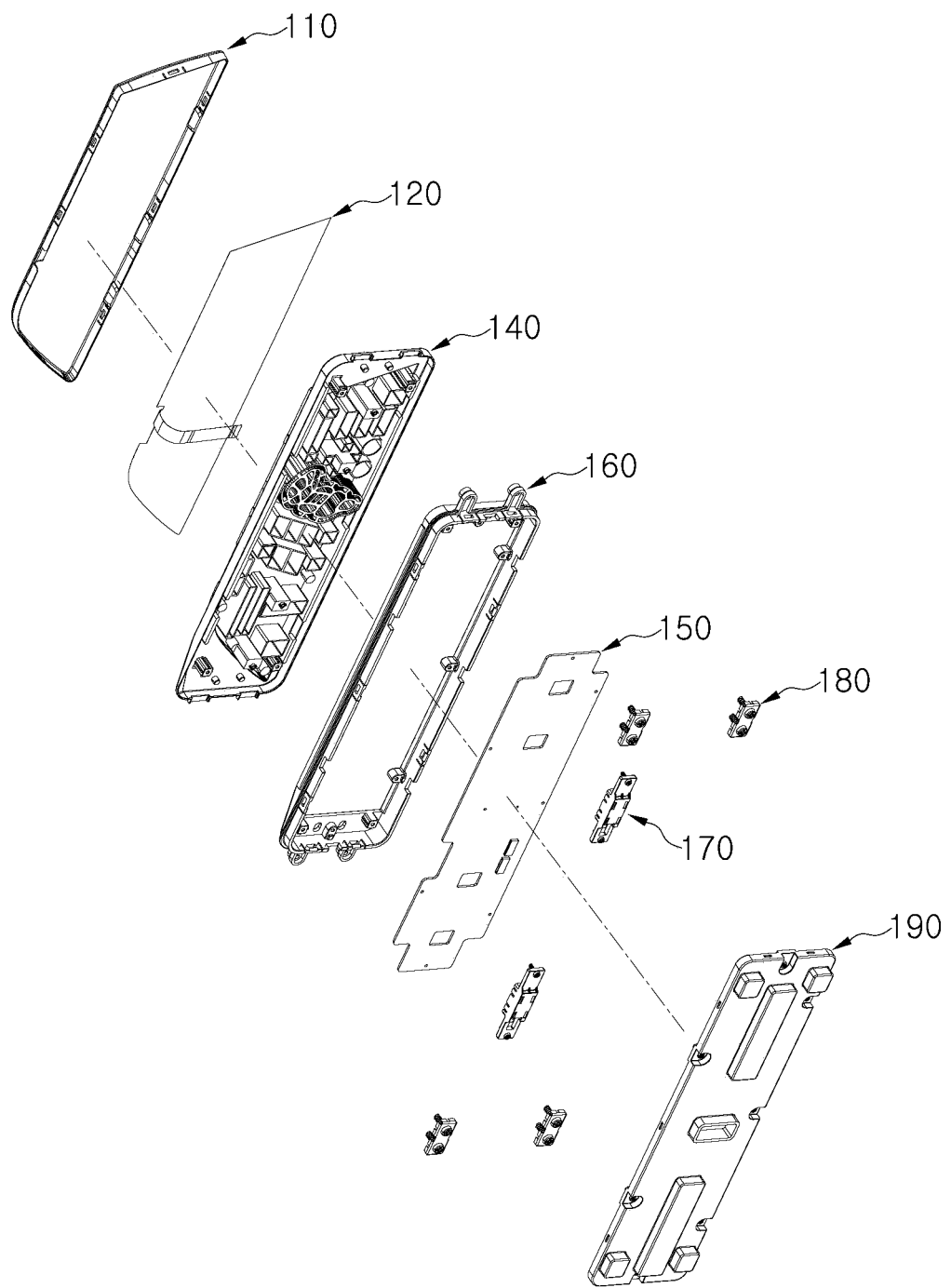
FIG. 3 is an exploded perspective view illustrating each component of the vehicle smart garnish of FIG. 1 viewed from a rear.

FIG. 2 is an exploded perspective view illustrating each component of the vehicle smart garnish of FIG. 1 viewed from a front. FIG. 3 is an exploded perspective view illustrating each component of the vehicle smart garnish of FIG. 1 viewed from a rear.

Referring to FIGS. 2 and 3, the smart garnish 100 may include an upper casing 110, a capacitive touch sensor pad 120, a holder casing 140, a circuit board 150, and a body casing 160. The upper casing 110 is provided with various symbols in an arithmetic manner and is exposed to the outside. The capacitive touch sensor pad 120 recognizes that a specific symbol is touched. A light guide path corresponding to a symbol is formed in the holder casing 140. The circuit board 150 on which a light emitting element is mounted is stably mounted in the body casing 160.

The upper casing 110 is exposed to the outside as the vehicle interior material. The light emittance causes the symbols corresponding to switching function or marks to appear visually conspicuous. Thus, the aesthetic feature is enhanced, thereby achieving the effect of decorating the interior of the vehicle.

The touch sensor pad 120 having a capacitive touch sensor electrode corresponding to a switching function symbol is positioned behind the upper casing 110. The touch sensor pad 120 is stably mounted in the holder casing 140. The touch sensor pad 120 may include a transparent board and a transparent electrode so that light can pass therethrough.

The light guide path corresponding to each symbol is formed in the holder casing 140 so that light entering from the rear is emitted to the symbol on the upper casing 110.

Here, a light reflection layer and an optical window are provided on the light guide path to improve the light emission characteristic.

The circuit board 150 on which the light emitting element emitting light is mounted and for detecting a touch signal of the touch sensor pad 120 is stably mounted in the body casing 160. The circuit board 150 is positioned at the rear of the holder casing 140.

The smart garnish 100 may further include a haptic actuator 170, a buffer 180, and a lower casing 190. The haptic actuator 170 notifies a user's touch through vibration. The buffer 180 provides stability against the vibration of the haptic actuator 170. The lower casing 190 has an internal space in which the haptic actuator 170 and the buffer 180 are accommodated.

Figure 4:
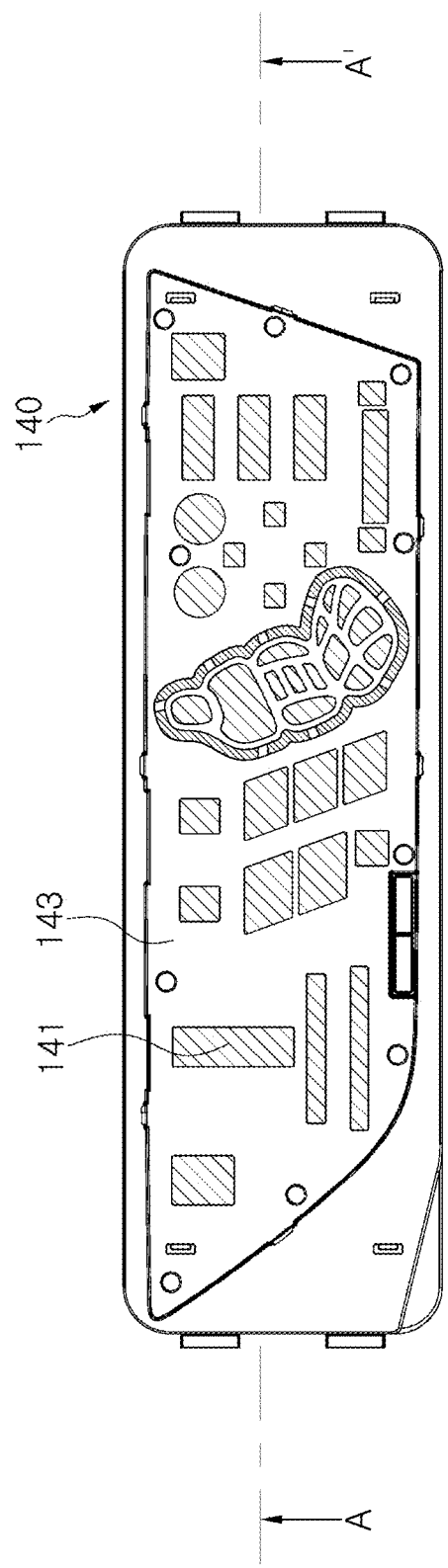
FIG. 4 is a front view illustrating an implementation example of a holder casing of the vehicle smart garnish according to the first exemplary embodiment.
Figure 5:
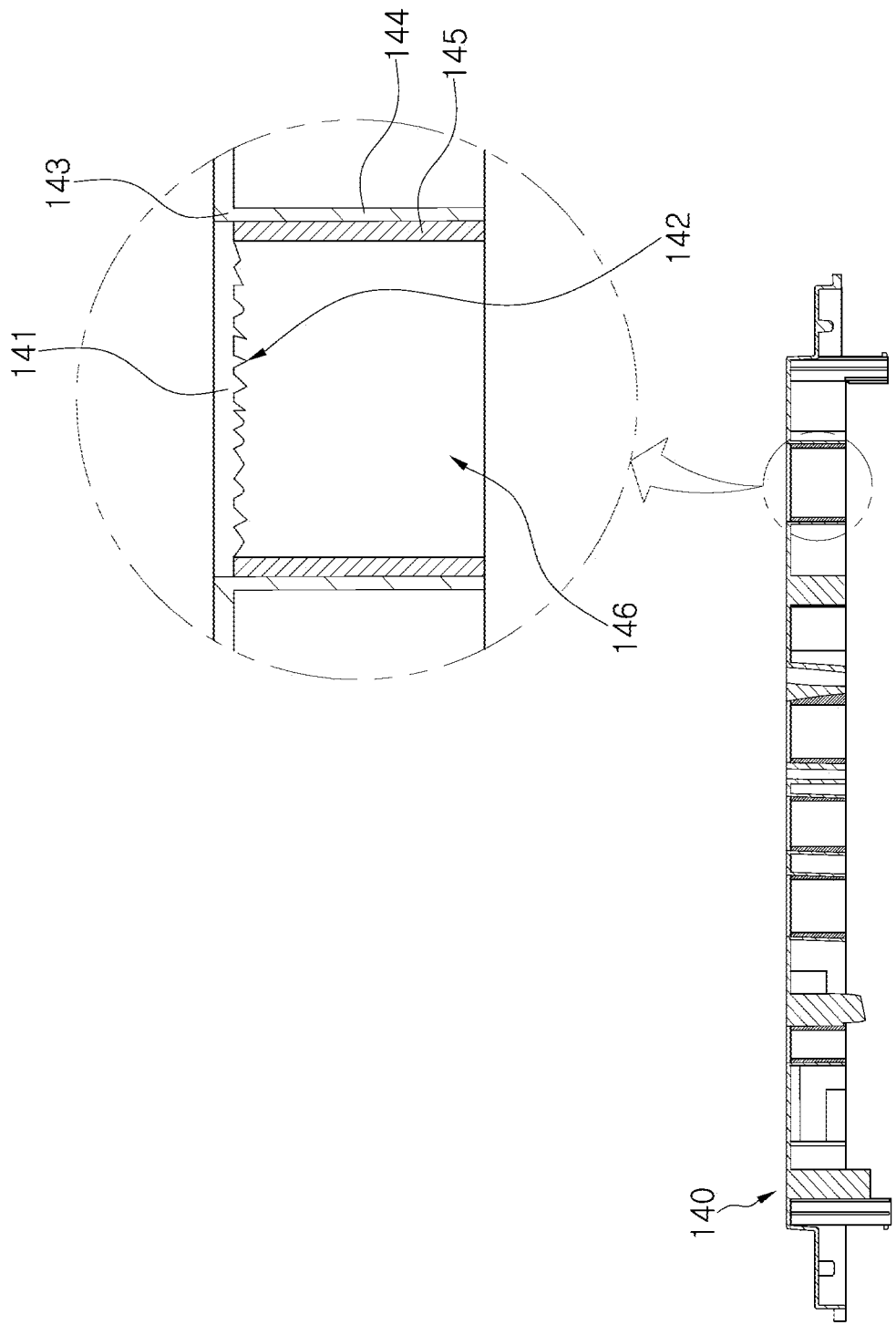
FIG. 5 is a partial cross-sectional view taken along line A-A' of FIG. 4.

FIG. 4 is a front view illustrating an implementation example of the holder casing 140 of the vehicle smart garnish according to the first exemplary embodiment. FIG. 5 is a partial cross-sectional view taken along line A-A' of FIG. 4.

Referring to FIGS. 4 and 5, the holder casing 140 is formed of a plastic injection-molded body 143 having the light guide path for guiding the light entering from behind the holder casing 140 to the symbol on the upper casing 110.

The light guide path in the holder casing 140 may include a light inlet through which light may enter from a first side of the light guide path, a light outlet through which the light may exit to a second side of the light guide path, and a light propagation path 146 formed by partitions 144 for guiding the light from the first side to the second side.

In the light guide path, a light reflection layer 145 is formed on each of the inner surfaces of the partitions 144 constituting the light propagation path 146 in order to improve light emission characteristics. The light reflection layer 145 is made of a material having a gloss property. The light reflection layer 145 reflects the light entering through the light inlet of the light guide path so that the reflected light escapes through the light outlet of the light guide path, and loss of light is reduced as much as possible.

Because the partitions 144 of the plastic injection-molded holder casing 140 are formed of plastic structures, the light passing through the light propagation path 146 may be absorbed by the partitions 144, resulting in loss of light. According to the exemplary embodiment, the light reflection layer 145 is formed on the inner surfaces of the partitions 144 to prevent light loss. Thus, the light can exit along the light propagation path 146 towards the symbol on the upper casing 110.

The light reflection layer 145 may be formed of a material containing indium or the like. Because indium has a high gloss property, it is a suitable material for forming a light reflection layer. It is understood that various materials having a gloss property and capable of reflecting light may be used.

Moreover, the light reflection layer 145 formed of a metal material such as indium may affect the capacitive touch sensor pad 120 stably mounted on a front surface of the holder casing 140. Therefore, it is necessary to adjust the conductivity of the light reflection layer 145. To this end, when the light reflection layer 145 is formed, the thickness thereof may be adjusted. Alternatively, the light reflection layer 145 may include an additive having a resistance property to reduce conductivity.

As described above, according to the exemplary embodiment, the light reflection layer 145 is formed on the light guide path in the holder casing 140. Thus, the light can be emitted to the symbol on the upper casing 110 while maximally reducing the loss of light emitted from the light emitting element.

Here, the light guide path employs a configuration in which the light exits through the light outlet. In addition, according to the exemplary embodiment, a transparent optical window 141 may be formed at the light outlet to transmit light, and surface roughness 142 may occur on at least one of front and rear surfaces of the optical window 141. For example, as illustrated in FIG. 5, the transparent optical window 141 may be formed on an end of the light propagation path 146, and the surface roughness 142 may occur on a surface of the transparent optical window 141.

The surface roughness 142 has a shape in which fine protrusions are regularly or irregularly distributed. It is understood that the shape and size of the protrusion, the degree of roughness, and the like may be variously adjusted as necessary.

For example, in order to minimize the loss of light passing through the optical window 141, the thickness of the optical window 141 is preferably formed to be 1.2 mm to 1.5 mm.

According to the exemplary embodiment, the optical window is formed at the light outlet of the light guide path, and the roughness is produced on the surface of the optical window. Thus, it is possible to obtain the effect of uniformly emitting light over the entire symbol on the upper casing.

That is, when light is emitted directly from the light emitting element, a portion corresponding to a center portion of the light emitting element of the symbol appears visually conspicuous as a spot. The farther away a portion of the symbol is from a spot portion, the less intensity of light in the portion of the symbol is. Thus, the shape of the symbol does not appear visually conspicuous in a uniform way. According to the exemplary embodiment, the surface roughness is produced on the surface of the optical window, so that the light can be emitted evenly throughout the symbol without being concentrated on the spot portion. Thus, the uniformity of light emission for the entire symbol can be improved.

For example, the holder casing 140 may be manufactured by transparent plastic injection molding and may be entirely coated with an opaque material. Then, only an area defined as the optical window 141 may be laser-etched to form the optical window 141.

Figure 6A:
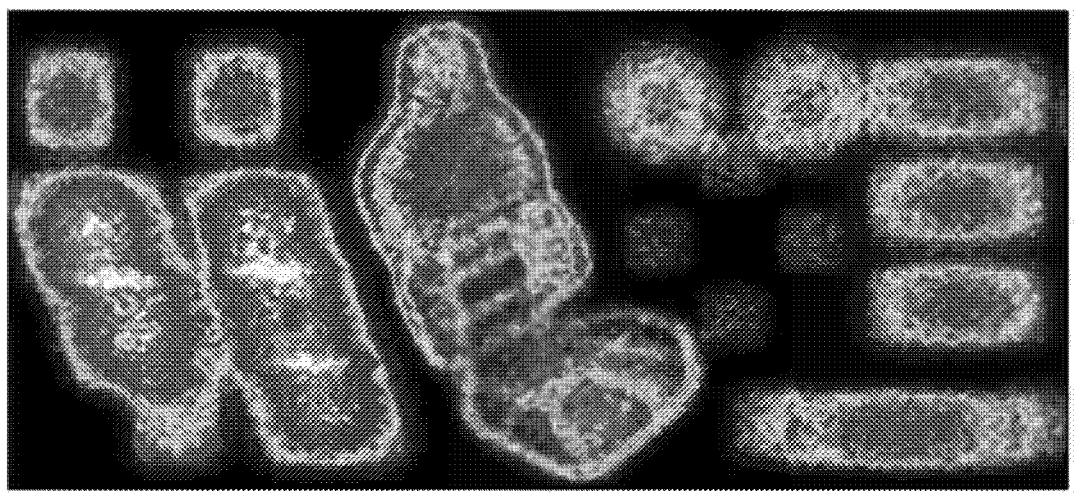
FIGS. 6A and 6B are photographs showing a light emission characteristic of the vehicle smart garnish according to a related art and an exemplary embodiment, respectively.
Figure 6B:

FIGS. 6A and 6B are photographs each showing a light emission characteristic of the vehicle smart garnish. FIG. 6A shows a result of measuring the intensity of light when the light guide path without the light reflection layer and the optical window is provided in a related art. FIG. 6B shows a result of measuring the intensity of light when the light guide path including the light reflection layer and the optical window is provided according to the exemplary embodiment.

Referring to FIGS. 6A and 6B, it can be seen that the intensity of light emitted to the entire symbol on the upper casing 110 is higher than that of the related art, and the light emission characteristic works in such a way that the entire symbol appears visually conspicuous in a uniform manner without any light spots.

Figure 7:
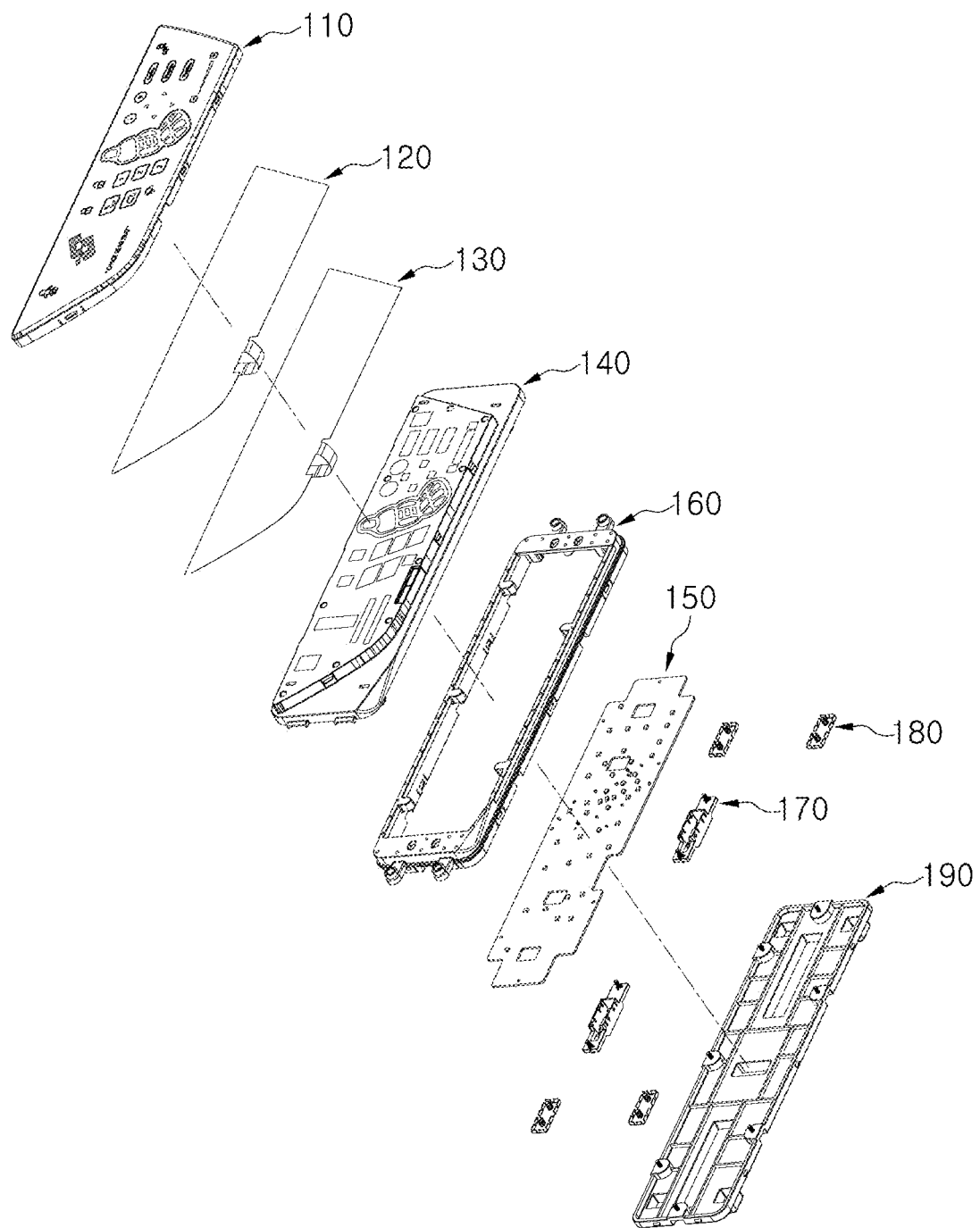
FIG. 7 is an exploded perspective view illustrating each component of a vehicle smart garnish according to a second exemplary embodiment.

Moreover, according to the exemplary embodiment, a force sensor is used to eliminate a touch recognition error. Thus, when a user simultaneously applies pressure and touch with a finger, the user can recognize that switching has been performed. FIG. 7 is an exploded perspective view illustrating each component of a vehicle smart garnish according to a second exemplary embodiment.

Referring to FIG. 7, the vehicle smart garnish according to the second exemplary embodiment has the same structure as the vehicle smart garnish according to the first exemplary embodiment of FIG. 2 except for a capacitive force sensor pad 130, so a redundant description of the same configuration will be omitted. The capacitive touch sensor pad 120 and the capacitive force sensor pad 130 are sequentially and stably mounted on the front surface of the holder casing 140.

The capacitive touch sensor pad 120 and the capacitive force sensor pad 130 may be spaced apart by a predetermined distance to form a space therebetween. Alternatively, a layer of a dielectric material may be interposed therebetween.

The capacitive force sensor pad 130 may be formed as a transparent electrode on a transparent board so that light emitted from the rear surface passes through the capacitive force sensor pad 130.

Figure 8:
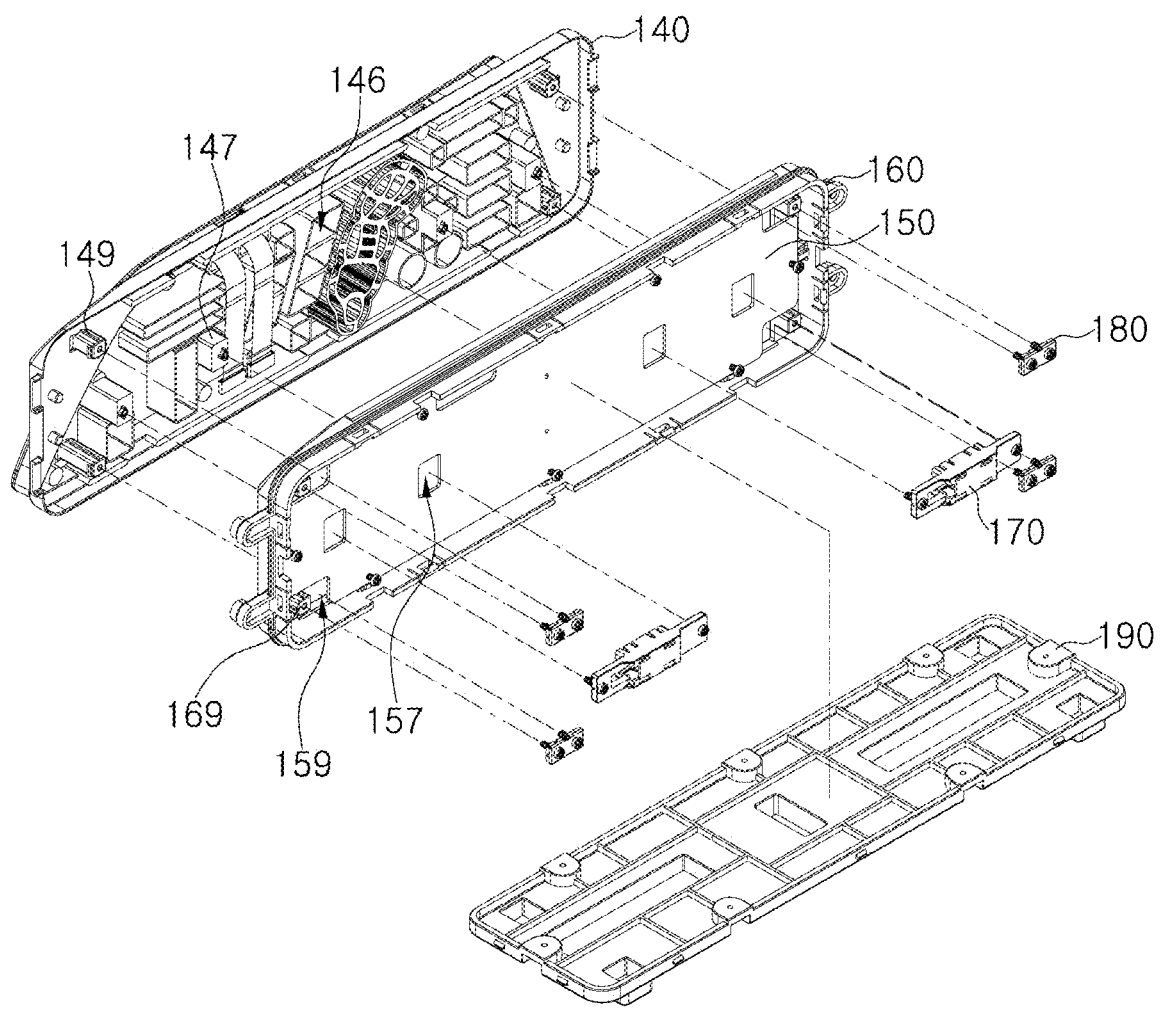
FIGS. 8 to 10 are views each illustrating a coupling configuration of a haptic actuator and a buffer of the vehicle smart garnish according to the first exemplary embodiment.
Figure 9:
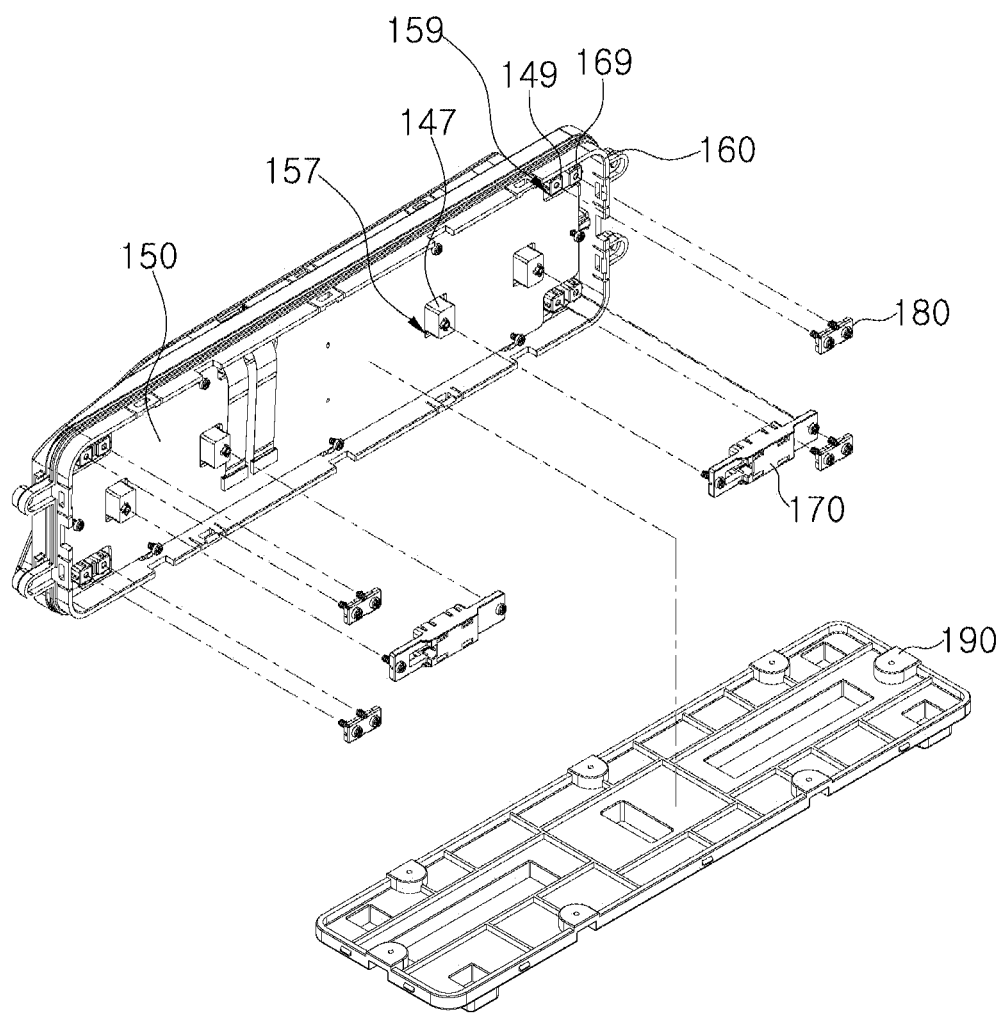
Figure 10:
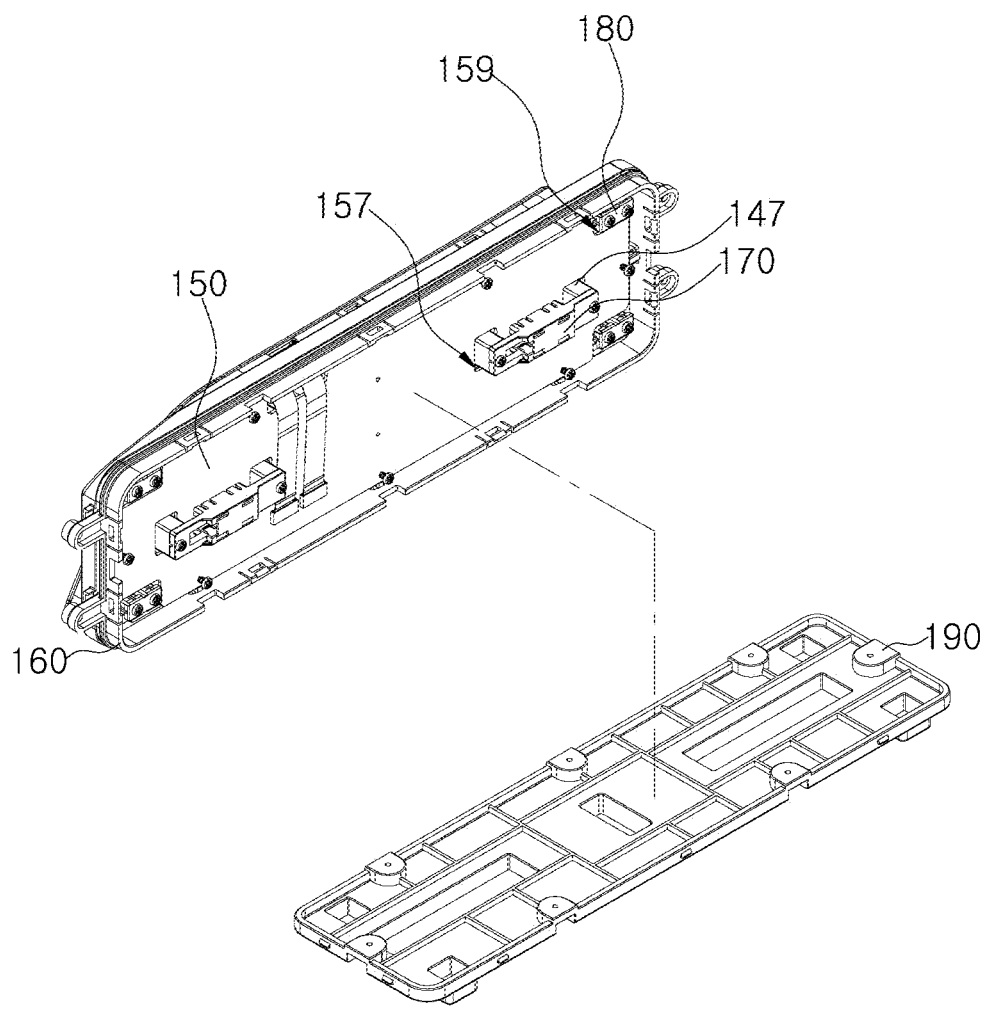

In addition, when it is recognized that the user performs a switching operation, the haptic actuator 170 signaling the switching operation to the user may be provided FIGS. 8 to 10 are views each illustrating a coupling configuration of the haptic actuator 170 and the buffer 180 of the vehicle smart garnish according to the first exemplary embodiment.

FIG. 8 is an exploded perspective view illustrating a state in which the haptic actuator 170 and the buffer 180 are ready to be coupled after the holder casing 140 having the light guidance path 146 and the upper casing 110 are coupled, and the circuit board 150 is stably mounted in the body casing 160.

FIG. 9 is an exploded perspective view illustrating a state in which the haptic actuator 170 and the buffer 180 are ready to be coupled after the body casing 160 is positioned at the rear of the holder casing 140.

Referring to FIGS. 8 to 10, a support leg 147 that protrudes and supports the haptic actuator 170 is provided on a rear surface of the holder casing 140. The support leg 147 extends to a predetermined length and passes through a through-hole 157 in the circuit board 150. A fastening portion of the haptic actuator 170 positioned at a predetermined distance away from the rear of the circuit board 150 is fastened to an end of the support leg 147. The position and number of the support legs 147 provided in the holder casing 140 may vary depending on the position of the haptic actuator 170 and the number of the haptic actuators 170.

In addition, a first buffer fastening part 149 is formed to protrude from the rear surface of the holder casing 140. One end of the buffer 180 is coupled to one end of the first buffer fastening part 149. The first buffer fastening part 149 extends to a predetermined length, passes through an opening 159 in the circuit board 150, and is fastened to a first end of the buffer 180.

The through-hole 157 through which the support leg 147 of the holder casing 140 passes is formed in the circuit board 150. The through-hole 157 is formed so that a space is wide enough for the haptic actuator 170 to vibrate the holder casing 140.

In addition, the opening 159 is formed to open inwardly from an edge of the circuit board 150. The first buffer fastening part 149 of the holder casing 140 protrudes through the opening 159 in the circuit board 150 and is fastened to the first end of the buffer 180.

Moreover, a second buffer fastening part 169 to which a second end of the buffer 180 is fastened is formed on the body casing 160 in which the circuit board 150 is stably mounted. The buffer 180 is fastened to the first and second buffer fastening parts 149 and 169.

The haptic actuator 170 can vibrate in an upward and downward direction (i.e., in a vertical direction). The haptic actuator 170 is fastened to one end of the support leg 147 of the holder casing 140, and is electrically connected to the circuit board 150. Thus, the haptic actuator 170 can vibrate the holder casing 140 in the upward and downward direction (i.e., in the vertical direction).

A spring plate absorbing the vibration in the upward and downward direction may be used as the buffer 180. The vibration of the holder casing 140 by the haptic actuator 170 is no longer propagated by the buffer 180. Thus, the body casing 160 in which the circuit board 150 is stably mounted can be stably maintained.

That is, when switching is performed on the symbol on the upper casing 110 fastened in front of the holder casing 140, the circuit board 150 recognizes that the switching is performed and operates the haptic actuator 170. Accordingly, the haptic actuator 170 vibrates the holder casing 140 up and down, and this vibration propagates to the upper casing 110 fastened in front of the holder casing 140. Thus, the user can recognize the vibration of the upper casing 110.

The haptic actuator 170 is fastened to the support leg 147 of the holder casing 140 and is spatially separated from the body casing 160 in which the circuit board 150 is stably mounted. The holder casing 140 and the body casing 160 in which the circuit board 150 is stably mounted are connected by the buffer 180. Thus, the absorption of the vibration by the buffer 180 stably maintains the body casing 160 in which the circuit board 150 is stably mounted.

The lower casing 190 having a space in which the haptic actuator 170 and the buffer 180 are positioned may be coupled to the body casing 160 at the rear of the body casing 160. Thus, the haptic actuator 170 and the buffer 180 may be protected from external physical impact.

According to the exemplary embodiment, the vibration in the vertical direction by the haptic actuator 170 may allow the user to recognize whether switching is performed, and the circuit board 150 may be stably maintained against the vibration.

In addition, when touch sensing pressure is applied and force sensing is performed at the same time as the pressure is applied, a normal switching operation can be recognized, thereby preventing a switching recognition error.

Figure 11:
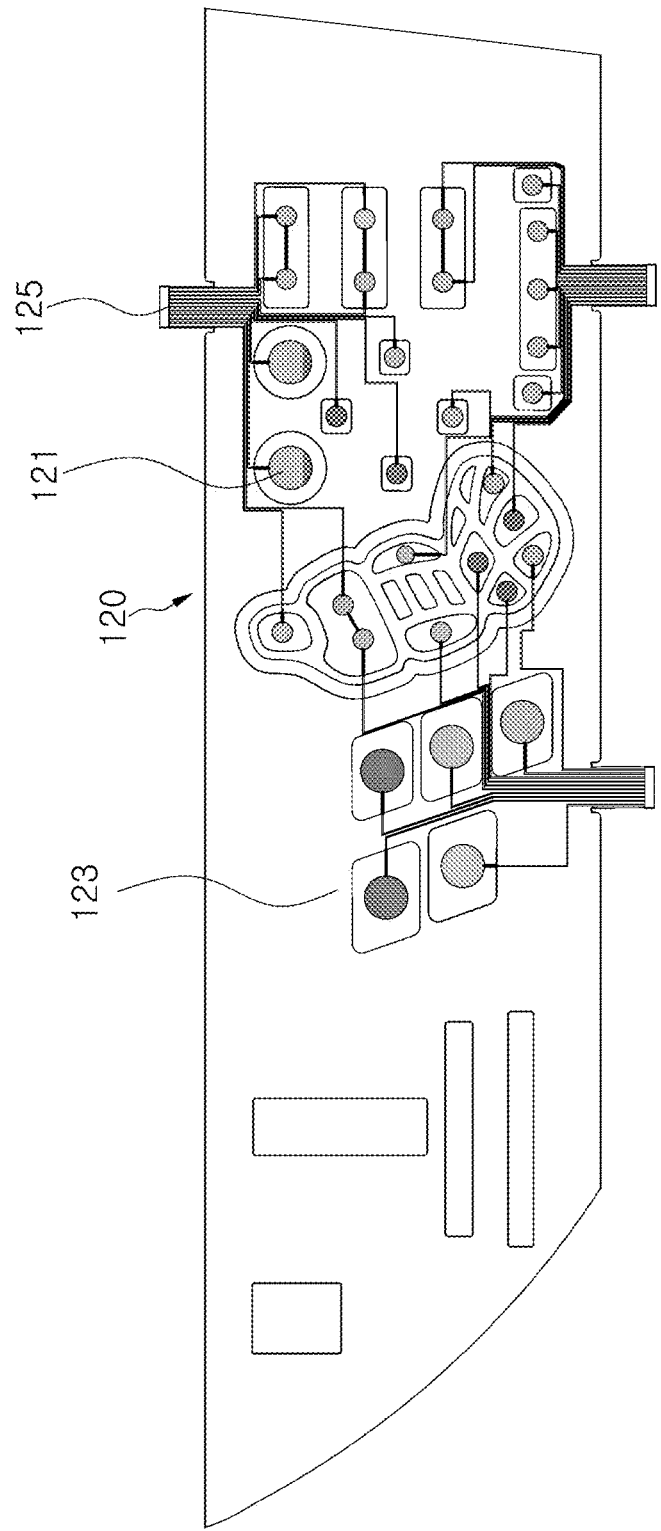
FIG. 11 is a view illustrating a capacitive touch sensor pad of the vehicle smart garnish according to the first exemplary embodiment.

FIG. 11 is a view illustrating the capacitive touch sensor pad 120 of the vehicle smart garnish according to the first exemplary embodiment.

Referring to FIG. 11, a touch electrode pad 121 is formed on the capacitive touch sensor pad 120 in a position corresponding to the switching function symbol of the upper casing 110. In addition, an electrically insulated region spaced apart from the touch electrode pad 121 by a predetermined distance is formed as ground electrode pads 123 serving as counter electrodes of the touch electrode pad 121.

The touch electrode pad 121 and the ground electrode pad 123 are electrically connected to a drive circuit of the circuit board 150. To this end, a connection member 125 may be provided. The connection member 125 extends from the touch electrode pad 121 and the ground electrode pad 123 and is connected to the circuit board 150. The connection member 125 may include a connector coupled to a pin provided on the circuit board 150 and a flexible conductive board.

The touch sensor pad 120 may be formed as a transparent electrode on a transparent board so that light emitted from a lower portion of the touch sensor pad 120 passes through the touch sensor pad 120 and propagates to an upper portion of the touch sensor pad 120.

Figure 12:
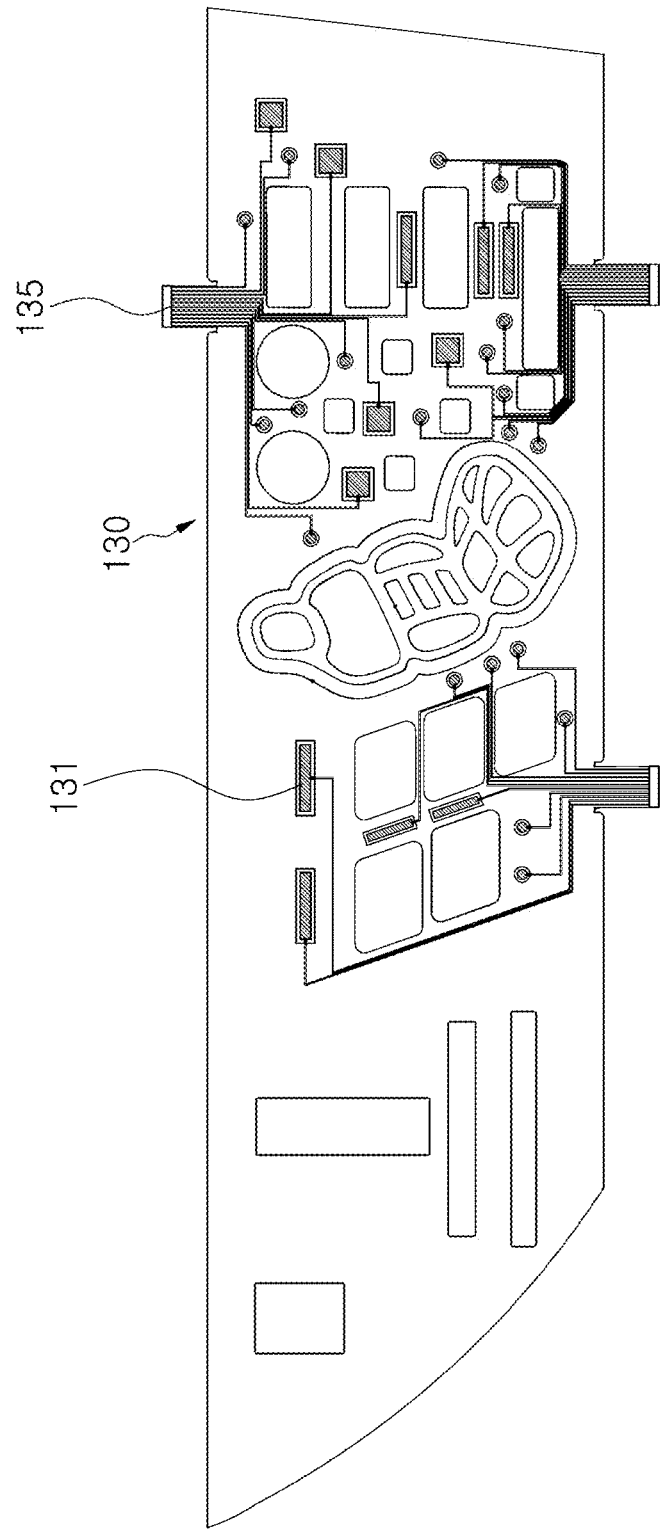
FIG. 12 is a view illustrating a capacitive force sensor pad of the vehicle smart garnish according to the first exemplary embodiment.

FIG. 12 is a view illustrating the capacitive force sensor pad 130 of the vehicle smart garnish according to the first exemplary embodiment.

Referring to FIG. 12, capacitive force electrode pads 131 may be formed on the capacitive force sensor pad 130. The capacitive force electrode pads 131 are distributed in various positions corresponding to the switching function symbol on the upper casing 110.

For example, the capacitive force electrode pads 131 may be distributively formed in portions opposite to the ground electrode pads 123 of the capacitive touch sensor pad 120 of FIG. 11 of the capacitive force sensor pad 130. That is, the ground electrode pad 123 of the capacitive touch sensor pad 120 is used as a counter electrode of the capacitive force electrode pad 131, and a change in capacitance according to a change in a size of a space between the capacitive force electrode pad 131 and the ground electrode pad 123 of the capacitive touch sensor pad 120 is recognized.

The capacitive force electrode pad 131 is electrically connected to the drive circuit of the circuit board 150. To this end, a connection member 135 may be provided. The connection member 135 extends from the capacitive force electrode pad 131 and is connected to the circuit board 150. The connection member 135 may be configured to couple a connector fastened to a pin provided on the circuit board 150 and a flexible conductive board.

FIGS. 11 and 12 illustrate that a plurality of connection members 125 and 135 coupled to the circuit board 150 are provided. However, it is understood that the position and number of the connection members 125 and 135 may vary depending on the number and position of the touch electrode pads 121 and the capacitive force electrode pads 131.

Then, the capacitive touch sensor pad 120 of FIG. 11 and the capacitive force sensor pad 130 of FIG. 12 are sequentially and stably mounted in the holder casing 140. In this case, the capacitive touch sensor pad 120 and the capacitive force sensor pad 130 may be spaced apart from each other by a predetermined distance to form a space therebetween. Alternatively, a dielectric layer may be interposed therebetween.

The configurations of the capacitive touch sensor pad 120 and the capacitive force sensor pad 130 allows contact to ground when pressure is applied to an area other than the touch electrode pad 121. Thus, even if a gap is changed, the touch sensing is not performed and an operation is not performed. However, when the user simultaneously applies pressure and touch to a specific symbol, the upper casing 110 is pressed and the corresponding touch electrode pad 121 performs touch sensing. In this case, the capacitive force electrode pads 131 detect a change in capacitance according to a change in a size of the gap.

That is, according to the exemplary embodiment, when the user simultaneously applies pressure and touch to the corresponding symbol, the user recognizes the touch sensing and the force sensing. Thus, a sensing error caused by an incorrect touch can be eliminated.

According to one or more exemplary embodiments, it is possible to improve the light emission characteristic that makes the switch, the symbol mark, or the like which is positioned on the garnish visually conspicuous. Thus, the aesthetic characteristics of the interior of the vehicle can be further improved, and the emotional attachment of the occupant to the vehicle can be increased. Furthermore, the efficiency of the light emitting element can be increased.

While exemplary embodiments have been described with reference to the accompanying drawings, it is to be understood by those skilled in the art that various modifications in form and details may be made therein without departing from the sprit and scope as defined by the appended claims. Therefore, the description of the exemplary embodiments should be construed in a descriptive sense and not to limit the scope of the claims, and many alternatives, modifications, and variations will be apparent to those skilled in the art.

What is claimed is:

1. A vehicle smart garnish of a vehicle comprising:
   an upper casing formed with a plurality of symbols to which light is emitted, the upper casing and the plurality of symbols being exposed as a part of an interior material of the vehicle;
   a capacitive touch sensor pad corresponding to at least one of the plurality of symbols and recognizing a touch;
   a holder casing in which the capacitive touch sensor pad is mounted and coupled from a rear of the upper casing;
   a circuit board positioned behind the holder casing and on which a light emitting element emitting light is mounted and configured to detect a touch signal of the capacitive touch sensor pad, the light emitting element being corresponding to the at least one of the plurality of symbols, and
   a haptic actuator configured to vibrate the holder casing in a vertical direction,
   wherein the holder casing includes a light guide path for guiding the light emitted from the light emitting element to the corresponding at least one of the plurality of symbols, and a light reflection layer is formed on a partition of the light guide path,
   wherein the holder casing comprises a support leg protruding downward in the vertical direction from a rear surface thereof and the haptic actuator is coupled to an vertical end of the support leg such that the support leg is disposed between rear surface of the holder casino and the haptic actuator in the vertical direction.

2. The vehicle smart garnish of claim 1, wherein the light reflection layer is formed of a material containing indium.

3. The vehicle smart garnish of claim 1, wherein a thickness of the transparent optical window is 1.2 mm to 1.5 mm to minimize a loss of light passing through the transparent optical window.

4. The vehicle smart garnish of claim 1, further comprising:
   a body casing in which the circuit board is mounted.

5. The vehicle smart garnish of claim 4, wherein a through-hole through which the support leg of the holder casing passes is formed in the circuit board, and the haptic actuator vibrates in the vertical direction in the through-hole.

6. The vehicle smart garnish of claim 5, further comprising:
   a buffer with a first side fastened to the holder casing and a second side fastened to the body casing to stably maintain the body casing against vertical vibration of the holder casing.

7. The vehicle smart garnish of claim 6, wherein the buffer is a plate spring capable of absorbing the vibration in the vertical direction.

8. The vehicle smart garnish of claim 7, further comprising:
   a lower casing coupled to the body casing from the rear and having an internal space in which the haptic actuator and the buffer are positioned.

9. The vehicle smart garnish of claim 6, wherein an opening is formed to open inwardly from an edge of the circuit board, a first buffer fastening part protruding through the opening in the circuit board and fastened to one end of the buffer is formed in the holder casing, and a second buffer fastening part to which the other end of the buffer is fastened is formed on the body casing.

10. The vehicle smart garnish of claim 1, further comprising:
    a capacitive force sensor pad configured to recognize that pressure is applied to at least one of the plurality of symbols,
    wherein the capacitive touch sensor pad and the capacitive force sensor pad are sequentially mounted in the holder casing, and
    the circuit board detects a pressure application signal of the capacitive force sensor pad.

11. The vehicle smart garnish of claim 10, wherein a touch electrode pad is formed on the capacitive touch sensor pad in a position corresponding to the plurality of symbols of the upper casing, an electrically insulated region spaced apart from the touch electrode pad by a predetermined distance is formed as a ground electrode pad serving as a counter electrode of the touch electrode pad, and a connection member extending from the touch electrode pad and the ground electrode pad and connected to the circuit board is formed in the capacitive touch sensor pad, and
    wherein a capacitive force electrode pad is formed on the capacitive force sensor pad in a position corresponding to the plurality of symbols of the upper casing, and a connection member extending from the capacitive force electrode pad and connected to the circuit board is formed in the capacitive force sensor pad.

12. The vehicle smart garnish of a vehicle of claim 1,
    wherein the light reflection layer is made of a glossy material, reflects light entering from a first side of the light guide path, and emits the reflected light to a second side of the light guide path toward the corresponding at least one of the plurality of symbols.

13. The vehicle smart garnish of a vehicle of claim 1,
    wherein the light guide path comprises: a light inlet formed on a first side of the light guide path through which the light enters; a light propagation path having the partition for guiding the light entering through the light inlet, the light reflection layer being formed on the partition; and a light outlet formed on a second side of the light guide path through which the light exits toward the corresponding at least one of the plurality of symbols.

14. The vehicle smart garnish of a vehicle of claim 13,
    wherein the light outlet comprises a transparent optical window through which the light passes.

15. The vehicle smart garnish of a vehicle of claim 14,
    wherein a surface roughness is formed on at least one of front and rear surfaces of the transparent optical window.

16. The vehicle smart garnish of claim 15, wherein the surface roughness has a shape in which fine protrusions are regularly or irregularly distributed.

17. A vehicle smart garnish of a vehicle comprising:
    an upper casing formed with a plurality of symbols to which light is emitted, the upper casing and the plurality of symbols being exposed as a part of an interior material of the vehicle;
    a capacitive touch sensor pad corresponding to at least one of the plurality of symbols and recognizing a touch;
    a capacitive force sensor pad configured to recognize that pressure is applied to at least one of the plurality of symbols;

a holder casing in which the capacitive touch sensor pad and the capacitive force sensor pad are sequentially mounted and coupled from a rear of the upper casing;

a circuit board positioned behind the holder casing and on which a light emitting element emitting light is mounted and configured to detect a touch signal of the capacitive touch sensor pad and a pressure application signal of the capacitive force sensor pad, the light emitting element being corresponding to the at least one of the plurality of symbols, and a haptic actuator configured to vibrate the holder casing in a vertical direction, wherein the holder casing includes a light guide path for guiding the light emitted from the light emitting element to the corresponding at least one of the plurality of symbols, and a light reflection layer is formed on a partition of the light guide path, wherein the holder casing comprises a support leg protruding downward in the vertical direction from a rear surface thereof and the haptic actuator is coupled to an vertical end of the support leg such that the support leg is disposed between the rear surface of the holder casino and the haptic actuator in the vertical direction.

18. The vehicle smart garnish of claim 17, wherein the capacitive touch sensor pad and the capacitive force sensor pad are spaced apart from each other by a predetermined distance to form a space therebetween, or a dielectric layer is interposed therebetween.

* * * * *